US011206744B2

(12) United States Patent
Wang et al.

(10) Patent No.: US 11,206,744 B2
(45) Date of Patent: Dec. 21, 2021

(54) HEAT DISSIPATION STRUCTURE, CAMERA AND MOBILE PLATFORM

(71) Applicant: SZ DJI OSMO TECHNOLOGY CO., LTD., Shenzhen (CN)

(72) Inventors: Ping Wang, Shenzhen (CN); Ting Wang, Shenzhen (CN); Yongjie Huang, Shenzhen (CN)

(73) Assignee: SZ DJI OSMO TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/721,047

(22) Filed: Dec. 19, 2019

(65) Prior Publication Data
US 2020/0128693 A1 Apr. 23, 2020

Related U.S. Application Data

(63) Continuation of application No. PCT/CN2017/105908, filed on Oct. 12, 2017.

(51) Int. Cl.
H05K 7/20 (2006.01)
H04N 5/225 (2006.01)
H05K 5/02 (2006.01)

(52) U.S. Cl.
CPC ..... H05K 7/20154 (2013.01); H04N 5/22521 (2018.08); H05K 5/0213 (2013.01);
(Continued)

(58) Field of Classification Search
CPC ............. H05K 7/20154; H05K 5/0213; H05K 7/20172; H05K 7/20181; H05K 7/20209;
(Continued)

(56) References Cited

U.S. PATENT DOCUMENTS

2003/0133265 A1* 7/2003 Kinsey .................... G06F 1/203
361/679.48
2003/0154598 A1* 8/2003 Shinotou .............. H05K 7/1007
29/834
(Continued)

FOREIGN PATENT DOCUMENTS

CN 201536394 U 7/2010
CN 205232317 U 5/2016
(Continued)

OTHER PUBLICATIONS

Tang Yin; Yang Feihu, "Radiator, unmanned aerial vehicle and movable equipment", Aug. 29, 2017, Shenzhen Dajiang Innovation Technology Co LTD, Entire Document (Translation of CN 107114000) (of record, cited in IDS, including Original Copy). (Year: 2017).*
(Continued)

Primary Examiner — Stephen S Sul
(74) Attorney, Agent, or Firm — Anova Law Group, PLLC

(57) ABSTRACT

The embodiments of the present disclosure provide a heat dissipation structure, applied to an electronic device. The electronic device includes a power consumption element, and the power consumption element disposed in an accommodation cavity. The heat dissipation structure includes a cover, configured to cover and seal the accommodation cavity. The cover is thermally connected to the power consumption element through a heat-conducting element. The heat dissipation structure further includes a heat-dissipation component, thermally connected to the cover and including a heat-dissipation module and a fan. The heat-dissipation module is disposed in an air outlet channel of the fan, such that the wind generated by the fan takes away the heat of the heat-dissipation module.

19 Claims, 4 Drawing Sheets

(52) U.S. Cl.
CPC ..... *H05K 7/20172* (2013.01); *H05K 7/20181* (2013.01); *H05K 7/20209* (2013.01)

(58) Field of Classification Search
CPC ............ H05K 7/20136; H04N 5/22521; H01L 23/38; H01L 33/645
USPC ......... 361/679.47, 679.48, 679.52, 695, 696, 361/697, 709, 719, 720
See application file for complete search history.

(56) References Cited

U.S. PATENT DOCUMENTS

| | | | | |
|---|---|---|---|---|
| 2004/0169771 | A1* | 9/2004 | Washington | H04N 5/2251 348/374 |
| 2004/0174673 | A1* | 9/2004 | Lin | G06F 1/20 361/679.54 |
| 2009/0244845 | A1* | 10/2009 | Nagamoto | H05K 7/20918 361/697 |
| 2011/0204409 | A1* | 8/2011 | Sung | H05K 1/0203 257/99 |
| 2013/0250513 | A1 | 9/2013 | Wu | |
| 2014/0055671 | A1* | 2/2014 | Kawamura | H04N 5/2252 348/374 |
| 2014/0063732 | A1* | 3/2014 | Lee | G06F 1/203 361/679.47 |
| 2015/0059362 | A1* | 3/2015 | Chou | H01L 23/38 62/3.7 |
| 2015/0070557 | A1* | 3/2015 | Petty | H04N 5/2253 348/333.01 |
| 2015/0116937 | A1* | 4/2015 | Huesgen | H05K 5/0091 361/696 |
| 2015/0351282 | A1* | 12/2015 | Fujiwara | G06F 1/203 361/696 |
| 2016/0233145 | A1* | 8/2016 | Caroff | H01L 23/4275 |
| 2016/0301819 | A1* | 10/2016 | Petty | G03B 17/55 |
| 2018/0368290 | A1* | 12/2018 | Rosales | B64C 39/024 |
| 2019/0021184 | A1* | 1/2019 | Williams | F04D 25/0613 |
| 2019/0033932 | A1* | 1/2019 | Ku | B64D 33/08 |

FOREIGN PATENT DOCUMENTS

| | | | |
|---|---|---|---|
| CN | 205510650 U | | 8/2016 |
| CN | 205830227 U | | 12/2016 |
| CN | 106604622 A | * | 4/2017 |
| CN | 106879232 A | | 6/2017 |
| CN | 107114000 A | | 8/2017 |
| CN | 207369504 U | | 5/2018 |
| JP | 2016096225 A | | 5/2016 |

OTHER PUBLICATIONS

Zhang Jian, "Unmanned aerial vehicle collecting device", Apr. 26, 2017, Guangdong Huodewei Information Tech Co LTD, Entire Document (translation of CN 106604622). (Year: 2017).*

The World Intellectual Property Organization (WIPO) International Search Report for PCT/CN2017/105908 dated Jun. 28, 2018 5 pages.

* cited by examiner

HEAT DISSIPATION STRUCTURE, CAMERA AND MOBILE PLATFORM

CROSS-REFERENCE TO RELATED APPLICATION

This application is a continuation of International Application No. PCT/CN2017/105908, filed Oct. 12, 2017, the entire content of which is incorporated herein by reference.

TECHNICAL FIELD

The present disclosure generally relates to the field of heat dissipation structure and, more particularly, relates to a heat dissipation structure applied to a camera, and a camera and a mobile platform using the heat dissipation structure.

BACKGROUND

Because an existing camera has a large size, and the chip inside the camera has a low power, the requirement for heat dissipation may not be high. However, with the increase in application requirements, today's cameras are increasingly developed in the direction of having light weight, small size, high definition, and better performance. As the size of the camera becomes smaller, the space for heat dissipation is also reduced, and thus temperature may have a larger influence on the camera. Therefore, the existing cooling method may not be able to meet the performance requirements of today's small cameras. For gimbal cameras used on mobile platforms (such as unmanned aerial vehicles), the power consumption is usually high. Therefore, the requirements on the quality of camera sensors are high, and correspondingly, the requirements on the operation temperature are also high. Because the imaging quality of the sensors and the amount of noise are closely related temperature, heat dissipation is extremely important for the performance of gimbal cameras. In addition, for gimbal cameras applied on mobile platforms, the requirements for dust resistance are also high.

SUMMARY

One aspect of the present disclosure provides a heat dissipation structure, applied to an electronic device. The electronic device includes a power consumption element, and the power consumption element disposed in an accommodation cavity. The heat dissipation structure includes a cover, configured to cover and seal the accommodation cavity. The cover is thermally connected to the power consumption element through a heat-conducting element. The heat dissipation structure further includes a heat-dissipation component, thermally connected to the cover and including a heat-dissipation module and a fan. The heat-dissipation module is disposed in an air outlet channel of the fan, such that the wind generated by the fan takes away the heat of the heat-dissipation module.

Another aspect of the present disclosure provides a camera. The camera includes an accommodation cavity, a power consumption element disposed in the accommodation cavity. The heat dissipation structure includes a cover, configured to cover and seal the accommodation cavity. The cover is thermally connected to the power consumption element through a heat-conducting element. The heat dissipation structure further includes a heat-dissipation component, thermally connected to the cover and including a heat-dissipation module and a fan. The heat-dissipation module is disposed in an air outlet channel of the fan, such that the wind generated by the fan takes away the heat of the heat-dissipation module.

Another aspect of the present disclosure provides a mobile platform. The mobile platform includes a central part and a camera disposed on the central part. The camera includes an accommodation cavity, a power consumption element disposed in the accommodation cavity, and a heat dissipation structure. The heat dissipation structure includes a cover, configured to cover and seal the accommodation cavity, and a heat-dissipation component, thermally connected to the cover and including a heat-dissipation module and a fan. The cover is thermally connected to the power consumption element through a heat-conducting element; and the heat-dissipation module is disposed in an air outlet channel of the fan, such that wind generated by the fan takes away heat of the heat-dissipation module.

Other aspects of the present disclosure can be understood by those skilled in the art in light of the description, the claims, and the drawings of the present disclosure.

BRIEF DESCRIPTION OF THE DRAWINGS

In order to more clearly illustrate the technical solutions in the embodiments of the present disclosure, the drawings that need to be used in the description of the embodiments will be briefly described below. It is obvious that the drawings in the following description are some embodiments of the present disclosure, and for those of ordinary skill in the art, other drawings may also be obtained according to these drawings without any creative effort.

DETAILED DESCRIPTION

Figure 1:
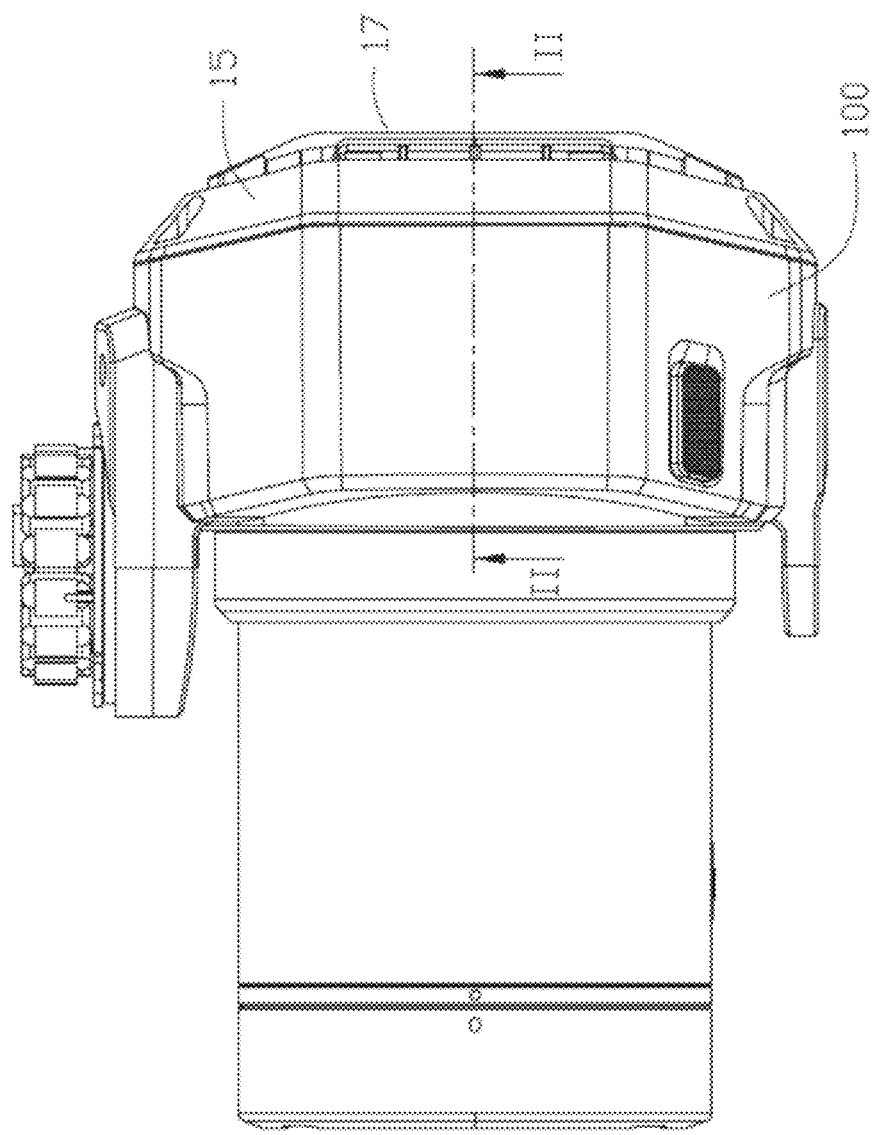
FIG. 1 illustrates a schematic structural view of a camera according to an embodiment of the present disclosure.

In the following, the technical solutions in various embodiments of the present disclosure will be clearly described with reference to the accompanying drawings. It should be understood that the described embodiments are only a part of the embodiments of the present invention, but not all of the embodiments. All other embodiments obtained by those skilled in the art based on the embodiments of the present disclosure without creative efforts are within the protection scope of the present disclosure.

It should be noted that when a component is referred to as being "fixed" to another component, the component can be directly on the other component or an intermediate component may be present; when a component is considered as "connected to" another component, the component can be directly connected to the other component or both components may be connected to an intermediate component; and when a component is considered as "disposed on" another component, the component can be directly disposed on the other component or an intermediate component may be presented. The technical terms such as "vertical", "horizontal", "left", "right", and similar expressions used herein are for illustrative purposes only.

Unless defined otherwise, all technical and scientific terms used herein have the same meaning as commonly understood by one of ordinary skill in the art to which this disclosure belongs. The terminology used in the description of the present disclosure is merely for the purpose of describing particular embodiments and is not intended to limit the present disclosure. The term "and/or" as used herein includes any and all combinations of one or more of the associated listed items.

In order to make the objects, features, and advantages of the present disclosure easy for understanding, specific embodiments of the present disclosure are described in detail below with reference to the accompanying drawings. In the detailed description of the embodiments of the present disclosure, for illustrative purposes, the cross-sectional views showing structures of various devices may be partially enlarged without following the general scale, and the schematic diagrams are merely shown as examples, which should not limit the scope of the present disclosure.

The present disclosure provides a heat dissipation structure. The heat dissipation structure may be applied to an electronic device and may be used to dissipate heat generated by a power consumption element in the electronic device. The electronic device may be, but is not limited to, a camera, a tablet computer, a mobile phone, etc. The electronic device may include a power consumption element, and the power consumption element may be disposed in an accommodation cavity. The heat dissipation structure may include a cover. The cover may be configured to cover and seal the accommodation cavity, and may be thermally connected to the power consumption element through a heat-conducting element. The heat dissipation structure may further include a fan and a heat dissipation component disposed outside the accommodation cavity. The heat dissipation component may be thermally connected to the cover, and may be located in an air outlet channel of the fan, so that the wind blown by the fan may be able to take away the heat of the heat dissipation component. In the following, a camera including a heat dissipation structure will be taken as an example for detailed description.

Figure 2:
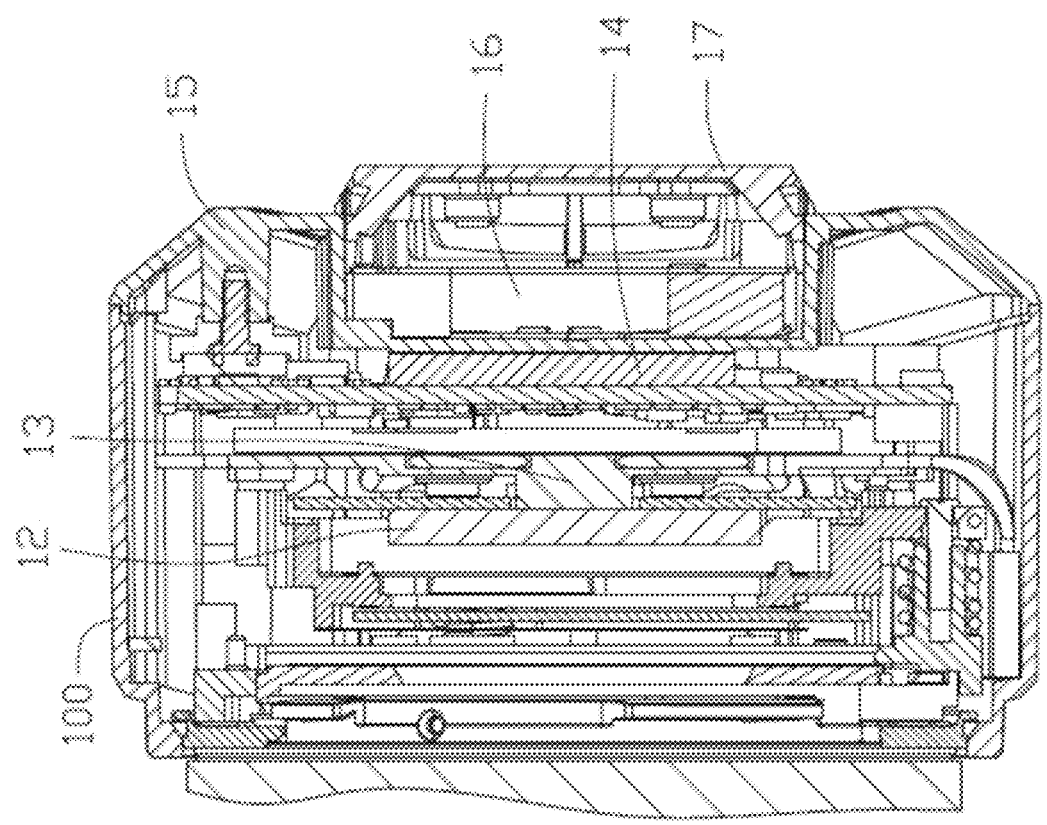
FIG. 2 illustrates a schematic cross-sectional view of the camera shown in FIG. 1 in an II-II line.
Figure 3:
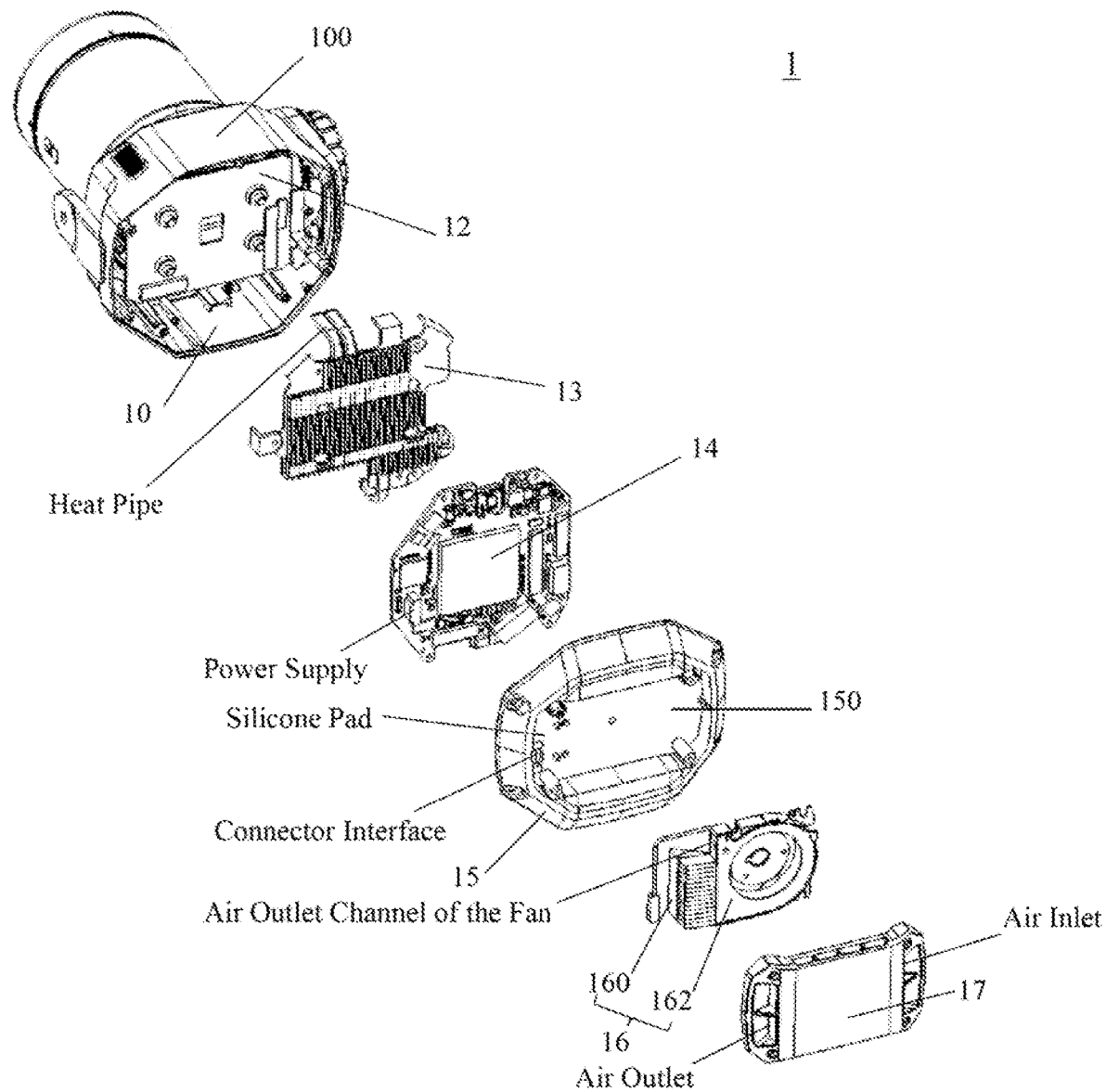
FIG. 3 illustrates a schematic exploded view of a camera according to an embodiment of the present disclosure.

FIG. 1 illustrates a schematic structural view of a camera according to an embodiment of the present disclosure, FIG. 2 illustrates a schematic cross-sectional view of the camera shown in FIG. 1 in an II-II line, and FIG. 3 illustrates a schematic exploded view of a camera according to an embodiment of the present disclosure. Referring to FIGS. 1-3, in one embodiment, a heat dissipation structure may be disposed in a camera 1. The camera 1 may include an accommodation-cavity outer shell 100, and the accommodation cavity outer shell 100 may be surrounded to form an accommodation cavity 10. The accommodation cavity 10 may contain a power consumption element of the camera. That is, a power consumption element of the camera may be disposed in the accommodation cavity 10. The power consumption element may include, but is not limited to, a circuit board and/or electronic components electrically connected to the circuit board. The electronic components may include, but are not limited to, a sensor component 12 and a processor module 14. The heat dissipation structure of the camera 1 may include a cover 15 configured to cover and seal the accommodation cavity 10. The cover 15 may be thermally connected to the power consumption element through a heat-conducting element. The heat-conducting element may include, but is not limited to, heat-conductive slime, heat-conductive silica gel, heat pipes, etc.

The heat dissipation structure of the camera 1 may further include a heat-dissipation component 16 disposed on the side of the cover 15 away from the accommodation cavity 100, and the heat dissipation component and the cover 15 may be thermally connected through a heat-conducting element. The heat-conducting element may also include heat-conductive slime, heat pipes, heat-conductive silica gel, etc. The heat-dissipation component 16 may include a heat-dissipation module 160 and a fan 162. The fan 162 may be a centrifugal fan or a vortex fan. The heat-dissipation module 160 may be disposed in an air outlet channel of the fan 162, such that the wind blown by the fan 162 can take away the heat of the heat-dissipation module 160. The heat-dissipation module 160 may be a heat-dissipation fin or a heat pipe.

The heat dissipation structure of the camera 1 may further include a fan back cover 17, and the heat-dissipation component 16 may be disposed between the cover body 15 and the fan back cover 17, and corresponding to the air inlet channel and the air outlet channel of the fan, an air inlet and an air outlet may be respectively disposed on the fan back cover 17. The arrangement of the fan back cover 17 may be able to further improve the dustproof performance.

In one embodiment, an accommodation groove 150 may be disposed on the side of the cover 15 away from the accommodation cavity 100, and the heat-dissipation component 16 may be disposed in the accommodation groove 150, so as to improve the stability of the heat-dissipation component 16, and make the structure of the camera 1 more compact.

In one embodiment, in order to further improve the heat dissipation performance, the power consumption element and the accommodation-cavity outer shell 100 may be thermally connected through a heat-conduction element. The heat-conduction element may also include heat-conductive slime, heat pipes, heat-conductive silica gel, etc.

In one embodiment, in order to further improve the heat dissipation performance, the accommodation-cavity outer shell 100 and the cover 15 may be fixedly and thermally connected.

In one embodiment, a connector interface 150 may be disposed on the cover 15, and the fan 162 may be electrically connected to a power supply disposed in the accommodation cavity 10 through the connector interface. To further improve the sealing effect of the accommodation cavity 100, the connector interface 150 may be sealed by a sealing element such as a silicone pad.

In one embodiment, the processor module 14 and the cover 15 may be thermally connected through a heat-conduction element. The heat-conduction element may also include heat-conductive slime, heat pipes, heat-conductive silica gel, etc.

In some embodiments, in order to further improve the heat dissipation performance, the heat dissipation component may further include a radiating plate. In some embodiments, the radiating plate may be, for example, a sensor heat sink 13 disposed between the sensor component 12 and the processor module 14. The sensor heat sink 13 can be thermally connected to the accommodation cavity 100 through a heat-conducting element. The heat-conducting element may also include heat-conductive slime, heat pipes, heat-conductive silica gel, etc.

In one embodiment, the sensor heat sink 13 may include a heat-dissipation fin, and the heat-dissipation fin may be thermally connected to the sensor component 12. At least one heat pipe may be disposed on the heat-dissipation fin. One end of each heat pipe of the at least one heat pipe may be fixedly connected to the heat-dissipation fin, and the other end may be thermally connected to the outer shell 100 of the accommodation cavity 10 through a heat-conducting element. The heat-conducting element may also include heat-conductive slime, heat pipes, heat-conductive silica gel, etc.

In some embodiments, the sensor heat sink 13 may include a plurality of pins, and the plurality of pins may be thermally connected to the outer shell 100 of the accommodation cavity 100 through a heat-conducting element. The heat-conducting element may also include heat-conductive slime, heat pipes, heat-conductive silica gel, etc.

It should be understood that, in some embodiments, the power consumption element may likely generate a large amount of heat. For example, the power consumption element may be a high power consumption element. In this case, a radiating plate, a heat-dissipation fin, or a heat pipe may be separately and thermally connected to the power consumption element, and the radiating plate, the heat-dissipation fin, or the heat pipe may then be thermally connected to the outer shell 100 or the cover 15 of the accommodation cavity 10 to direct the heat of the power consumption element to the outside.

The heat dissipation structure described above thermally conducts the heat generated by the power consumption component to the accommodation cavity outer shell 100 or the cover 15 via heat-dissipation components such as a radiating plate, a heat-dissipation fin, and a heat pipe, and then through a fan an heat-dissipation module disposed outside the accommodation cavity 10, the heat on the cover 15 is blown to the outside of the camera 1. As such, the purpose of heat dissipation may be achieved. In addition, because the cover 15 seals the accommodation cavity 10, the dust-proof requirements can also be met.

The present disclosure also provides a mobile platform. The mobile platform may include a camera according to various embodiments of the present disclosure. The camera may be a gimbal camera disposed on the mobile platform. The mobile platform may be used in any suitable environment, such as in the air (for example, the mobile platform is a rotorcraft, a fixed-wing aircraft, or an aircraft equipped with both fixed-wing and rotor), in water (for example, the mobile platform is a ship or a submarine), on the ground (for example, the mobile platform is a motorcycle, a car, a truck, a bus, a train, etc.), in space (for example, the mobile platform is a space shuttle, a satellite, or a space detector), or underground (for example, the mobile platform is a subway), or any combination of the above. In some embodiments, the mobile platform may be a rotorcraft, and the rotorcraft may be a single-rotor aircraft, a double-rotor aircraft, a triple-rotor aircraft, a quad-rotor aircraft, a hexa-rotor aircraft, an octo-rotor aircraft, etc.

Figure 4:
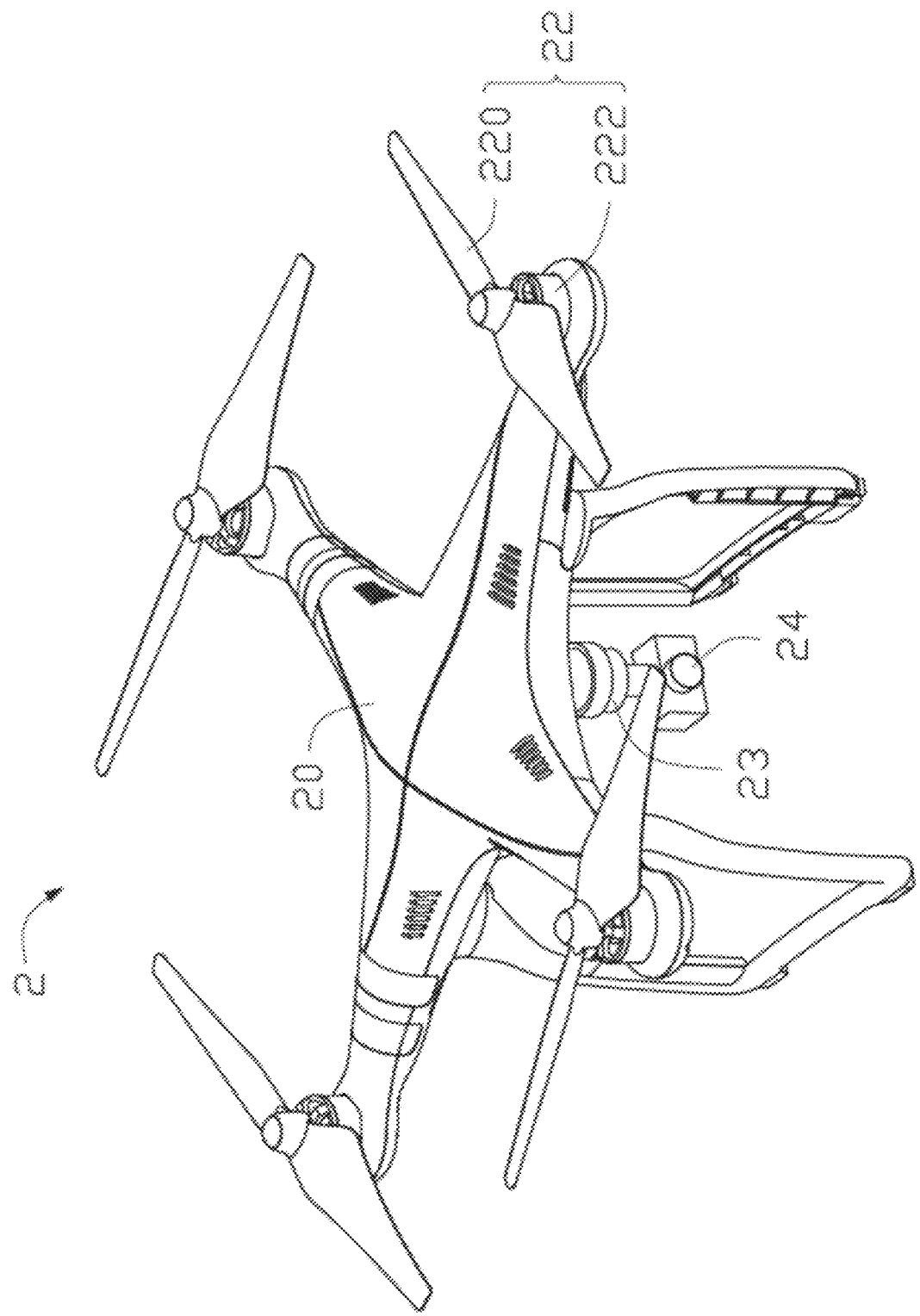
FIG. 4 illustrates a schematic structural view of an exemplary mobile platform according to an embodiment of the present disclosure.

FIG. 4 illustrates a schematic structural view of an exemplary mobile platform according to an embodiment of the present disclosure. Referring to FIG. 4, the mobile platform 2 is a quad-rotor unmanned aerial vehicle (UAV). The mobile platform 2 may include a central unit 20, a plurality of arms extending outward from the central unit 20, and a propulsion device 22 disposed on each arm. The number of the arms may be the same as the number of the rotors of the mobile platform 2.

In one embodiment, the mobile platform 2 may include four arms extending outward from the central unit 20, and correspondingly, the mobile platform 2 may include four propulsion devices 22. The propulsion device 22 may be used to move the mobile platform 2. The propulsion device 22 may include a motor 222 and a rotor 220 driven by the motor 222 to rotate. The rotation of the rotor 220 may be able to drive the mobile platform 2 to move. The movement of the mobile platform 2 may include taking-off, landing, hovering, and movements in the air with respect to three translational degrees of freedom and three rotational degrees of freedom.

In some embodiments, the propulsion device 22 may include one or more rotors 220. The rotor 220 may include one or more rotor blades connected to a rotation shaft. The rotor blade or the rotation shaft may be driven by the motor 222 to rotate.

In one embodiment, the propulsion device 22 of the mobile platform 2 is described to include four rotors 220. In other embodiments, other suitable numbers, types, or arrangements of the propulsion device 22 may be implemented. For example, the number of the rotors 220 may be one, two, three, four, five, six, seven, eight, or more. The rotor 220 may be disposed horizontally, vertically, or at any other suitable angle with respect to the center part 20 of the mobile platform. The angle of the rotor 220 may be fixed or may be changeable.

The distance between the rotation shafts of the rotors that are disposed opposite to each other may have any suitable value. For example, the distance between the rotation shafts of two rotors that are disposed opposite to each other may be less than or equal to 2 meters, or less than or equal to 5 meters. In one embodiment, the distance between the rotation shafts of two rotors that are disposed opposite to each other may be in a range approximately from 40 cm to 1 m, in a range approximately from 10 cm to 2 m, or in a range approximately from 5 cm to 5 m. The motor 222 may be a DC motor (e.g., a brush motor or a brushless motor) or an AC motor. In some embodiments, the motor 222 may be configured to drive one or more rotor blades.

In some embodiments, the central unit 20 may further include a camera 24 and a carrier 23 for carrying the camera 24. The carrier 23 may be a universal joint or other support structure that is capable of rotating around one or more axes with respect to the central unit 20. For example, as shown in FIG. 4, the carrier 23 may be the support structure that is able to rotate around a pitch axis and a roll axis with respect to the central unit 20. The camera 24 may be the camera 1 in various embodiments described above. Supported by the carrier 23, the camera 24 may be able to rotate around the one or more axes with respect to the central unit 20 to acquire images from multiple angles.

In one embodiment, a control system (e.g., a flight control system) may be disposed on the central unit 20 to control the flight of the mobile platform 2. In some embodiments, the control system may control the operation of the mobile platform 2 based on one or more of the following: the position of the mobile platform 2, the orientation of the mobile platform 2, the current state and/or time of the mobile platform 2, or the data acquired by the sensors or loads of the mobile platform 2.

Alternatively or in addition, the control system may include a receiver or other communication module disposed on the mobile platform 2 for receiving user instructions, for example, receiving user instructions from a remote terminal. The user instruction received through the receiver may be used to control the propulsion device 22, and the propulsion device 22 may be used to drive the UAV to operate, such as takeoff, fly, hover, or land.

In the various embodiments provided by the present application, it should be understood that the disclosed systems, devices, and methods may be implemented in other manners. For example, the device embodiments described above are merely illustrative. For instance, in various embodiments of the present disclosure, the units are divided or defined merely according to the logical functions of the units, and in actual applications, the units may be divided or defined in another manner. For example, multiple units or components may be combined or integrated into another system, or some features can be ignored or not executed. In addition, the mutual coupling or direct coupling or communication connection shown or discussed may be an indirect coupling or communication connection through some interface, device or unit, and may be in an electrical, mechanical, or other form.

The units described as separate components may or may not be physically separated, and the components displayed as a unit may or may not be physical in a unit, that is, they may be located in one place, or may be distributed to multiple network units. Some or all of the units may be selected according to actual needs to achieve the purpose of the solution of the embodiment.

In addition, each functional unit in each embodiment of the present application may be integrated into one processing unit, or each unit may exist physically separately, or two or more units may be integrated into one unit.

Finally, it should be noted that the above embodiments are merely illustrative of, but not intended to limit, the technical solutions of the present disclosure; although the present disclosure has been described in detail with reference to the above embodiments, those skilled in the art should understand that the technical solutions described in the above embodiments may be modified, or part or all of the technical features may be equivalently replaced; and the modifications or substitutions do not depart from the scope of the technical solutions of the embodiments of the present disclosure.

What is claimed is:

1. A heat dissipation structure, applied to an electronic device, the electronic device including a power consumption element, the power consumption element disposed in an accommodation cavity, and the heat dissipation structure comprising:
    a cover configured to cover and seal the accommodation cavity, wherein:
        the cover is thermally connected to the power consumption element through a heat-conducting element; and
        a connector interface is disposed on the cover; and
    a heat-dissipation component thermally connected to the cover and including a heat-dissipation module and a fan, wherein:
        the heat-dissipation module is disposed in an air outlet channel of the fan, such that wind generated by the fan takes away heat of the heat-dissipation module; and
        the fan is electrically connected to a power supply disposed in the accommodation cavity through the connector interface.

2. The heat dissipation structure according to claim 1, further including a fan back cover, wherein:
    the fan is disposed between the cover and the fan back cover; and
    an air inlet and an air outlet are disposed on the fan back cover corresponding to an air inlet channel and the air outlet channel of the fan, respectively.

3. The heat dissipation structure according to claim 1, wherein:
    an accommodation groove is disposed on a side of the cover away from the accommodation cavity, wherein the heat-dissipation component is disposed in the accommodation groove.

4. The heat dissipation structure according to claim 1, wherein:
    the heat-conducting element comprises a heat-conductive slime,
        wherein the power consumption element is thermally connected to the cover through the heat-conductive slime.

5. The heat dissipation structure according to claim 1, wherein:
    the accommodation cavity includes an outer shell, wherein the power consumption element is thermally connected to the outer shell.

6. The heat dissipation structure according to claim 5, wherein:
    the heat-conducting element comprises a heat-conductive slime,
        wherein the power consumption element is thermally connected to the outer shell through the heat-conductive slime.

7. The heat dissipation structure according to claim 5, wherein:
    the outer shell and the cover are fixedly and thermally connected.

8. The heat dissipation structure according to claim 1, wherein:
    the connector interface is sealed by a silicone pad.

9. The heat dissipation structure according to claim 1, wherein:
    the electronic device is a camera.

10. The heat dissipation structure according to claim 9, wherein:
    the heat-conducting element comprises a heat-conductive slime; and
    the power consumption element includes a processor module, wherein the processor module is connected to the cover through the heat-conductive slime.

11. The heat dissipation structure according to claim 9, wherein:
    the power consumption element includes a sensor component; and
    the heat dissipation structure further includes a radiating plate fixedly connected to the sensor component.

12. The heat dissipation structure according to claim 11, wherein:
    the heat-conducting element comprises a heat pipe, wherein the radiating plate is connected to an outer shell of the accommodation cavity through the heat pipe.

13. The heat dissipation structure according to claim 12, wherein:
    the heat-conducting element comprises a heat-conductive slime, wherein:
        one end of the heat pipe is fixedly connected to the radiating plate, and another end of the heat pipe is connected to the outer shell of the accommodation cavity through the heat-conductive slime.

14. The heat dissipation structure according to claim 11, wherein:
    the radiating plate includes a plurality of pins; and
    the heat conducting element comprises a heat-conductive slime, wherein the plurality of pins are connected to the outer shell of the accommodation cavity through the heat-conductive slime.

15. The heat dissipation structure according to claim 1, wherein:
    the fan is a centrifugal fan or a vortex fan.

16. The heat dissipation structure according to claim 1, wherein:
    the heat-dissipation component includes a radiating plate.

17. A camera, comprising an accommodation cavity, a power consumption element disposed in the accommodation cavity, and a heat dissipation structure, wherein the heat dissipation structure includes:
- a cover configured to cover and seal the accommodation cavity, wherein:
  - the cover is thermally connected to the power consumption element through a heat-conducting element; and
  - a connector interface is disposed on the cover; and
- a heat-dissipation component thermally connected to the cover and including a heat-dissipation module and a fan, wherein:
  - the heat-dissipation module is disposed in an air outlet channel of the fan, such that wind generated by the fan takes away heat of the heat-dissipation module; and
  - the fan is electrically connected to a power supply disposed in the accommodation cavity through the connector interface.

18. A mobile platform, comprising a central part and a camera disposed on the central part, wherein:
the camera includes an accommodation cavity, a power consumption element disposed in the accommodation cavity, and a heat dissipation structure, wherein the heat dissipation structure includes:
- a cover configured to cover and seal the accommodation cavity, wherein:
  - the cover is thermally connected to the power consumption element through a heat-conducting element; and
  - a connector interface is disposed on the cover; and
- a heat-dissipation component thermally connected to the cover and including a heat-dissipation module and a fan, wherein:
  - the heat-dissipation module is disposed in an air outlet channel of the fan, such that wind generated by the fan takes away heat of the heat-dissipation module; and
  - the fan is electrically connected to a power supply disposed in the accommodation cavity through the connector interface.

19. The mobile platform according to claim 18, wherein:
the mobile platform is an unmanned aerial vehicle.

* * * * *